United States Patent
Hagelin et al.

(10) Patent No.: US 8,234,774 B2
(45) Date of Patent: Aug. 7, 2012

(54) METHOD FOR FABRICATING A MICROELECTROMECHANICAL SYSTEM (MEMS) RESONATOR

(75) Inventors: Paul Merritt Hagelin, Saratoga, CA (US); Charles Grosjean, San Jose, CA (US)

(73) Assignee: SiTime Corporation, Sunnyvale, CA (US)

( * ) Notice: Subject to any disclaimer, the term of this patent is extended or adjusted under 35 U.S.C. 154(b) by 616 days.

(21) Appl. No.: 11/963,709

(22) Filed: Dec. 21, 2007

(65) Prior Publication Data

US 2009/0158566 A1 Jun. 25, 2009

(51) Int. Cl.
*H04R 31/00* (2006.01)

(52) U.S. Cl. ......... 29/594; 29/609.1; 310/344; 310/345; 310/346; 333/186; 333/187; 333/189

(58) Field of Classification Search .............. 29/592.1, 29/594, 595, 609.1, 831, 846; 310/344–346; 333/186–189
See application file for complete search history.

(56) References Cited

U.S. PATENT DOCUMENTS

| | | | | |
|---|---|---|---|---|
| 6,151,964 A | * | 11/2000 | Nakajima | 73/504.13 |
| 6,481,284 B2 | * | 11/2002 | Geen et al. | 73/504.12 |
| 6,481,285 B1 | * | 11/2002 | Shkel et al. | 73/504.13 |
| 7,202,761 B2 | | 4/2007 | Lutz et al. | |
| 2007/0277620 A1 | | 12/2007 | Melamud et al. | |
| 2009/0160581 A1 | * | 6/2009 | Hagelin et al. | 333/200 |

FOREIGN PATENT DOCUMENTS

WO  WO 2007072409 A2 *  6/2007

OTHER PUBLICATIONS

Melamud et al., "Composite Flexural Mode Resonator With Reduced Temperature Coefficient of Frequency", Department of Mechanical and Electrical Engineering, Stanford University, Stanford, California, USA, Hilton Head Workshop, Hilton Head, SC, 2006.
"Temperature Compensation for Constant-Frequency Electromechanical Oscillators", Berry et al., IBM Technical Disclosure Bulletin, vol. 14, No. 4, pp. 1237-1238, Sep. 1971.

* cited by examiner

*Primary Examiner* — Paul D Kim
(74) *Attorney, Agent, or Firm* — Neil A. Steinberg

(57) ABSTRACT

One embodiment of the present invention sets forth a method for decreasing a temperature coefficient of frequency (TCF) of a MEMS resonator. The method comprises lithographically defining slots in the MEMS resonator beams and filling the slots with oxide. By growing oxide within the slots, the amount of oxide growth on the outside surfaces of the MEMS resonator may be reduced. Furthermore, by situating the slots in the areas of large flexural stresses, the contribution of the embedded oxide to the overall TCF of the MEMS resonator is increased, and the total amount of oxide needed to decrease the overall TCF of the MEMS resonator to a particular target value is reduced. As a result, the TCF of the MEMS resonator may be reduced in a manner that is more effective relative to prior art approaches.

24 Claims, 14 Drawing Sheets

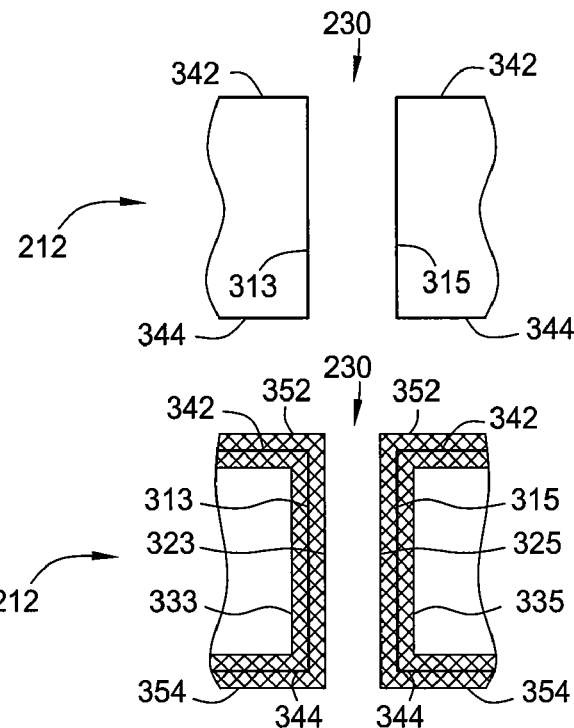
FIG. 3A
FIG. 3B
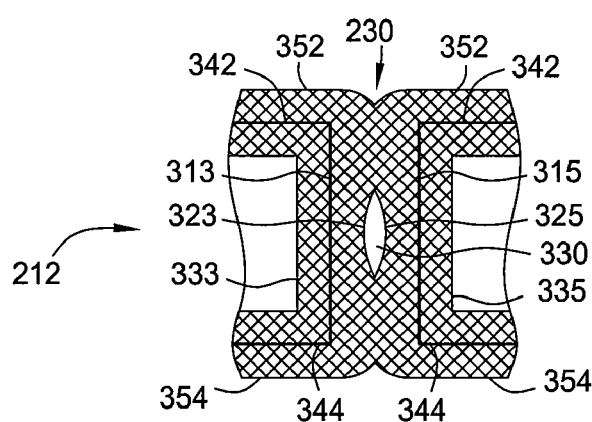
FIG. 3C
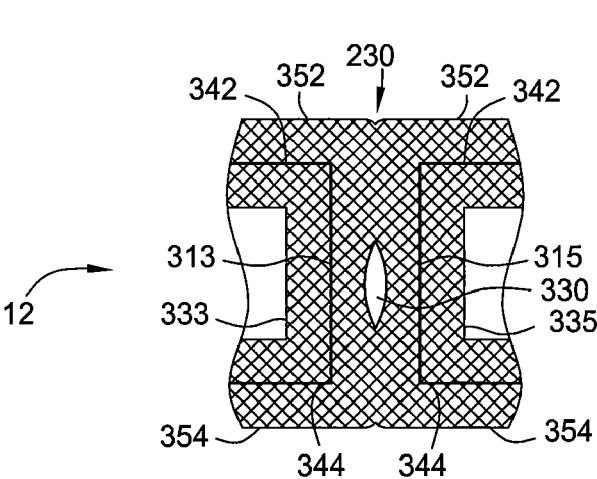
FIG. 3D

METHOD FOR FABRICATING A MICROELECTROMECHANICAL SYSTEM (MEMS) RESONATOR

BACKGROUND OF THE INVENTION

1. Field of the Invention

Embodiments of the present invention relate generally to temperature compensated microelectromechanical systems (MEMS) oscillators and, more specifically, to a temperature stable MEMS resonator.

2. Description of the Related Art

Many electronic devices include a real-time clock that runs continuously so that accurate time and date information, among other things, may always be maintained. Oscillators are commonly used in the timing circuitry of hand-held and portable electronic devices, such as wrist watches and cell phones. A typical oscillator circuit includes a resonator and an associated drive circuit to drive the resonator. Quartz is often used for the resonator. However, with the continuous push to decrease the size of electronic circuits, MEMS resonators fabricated from silicon are expected to replace quartz resonators in various oscillator circuit designs.

A major obstacle, though, to implementing MEMS resonators is that the mechanical properties of some MEMS resonator materials are dependent on temperature. Material stiffness is one example of a mechanical property that is dependent on the temperature. The temperature dependence of the material stiffness may be described with the temperature coefficient of stiffness, also known as temperature coefficient of Young's Modulus (TCE). As a result of the temperature dependence of the mechanical properties of MEMS resonator materials, properties of MEMS resonators (e.g., resonant frequency) may also exhibit temperature dependence. For example, a thermal coefficient of frequency (TCF) of a MEMS resonator, derived from the design of the resonator and the material properties of the one or more materials that make up the resonator, may be −30 ppm/° C., which means that if the MEMS resonator normally oscillates at a frequency of 1 MHz, then a 1° C. change in temperature results in a 30 Hz frequency shift. For some applications, the TCF of the resonator should be less than 1 ppm/° C. Consequently, many MEMS oscillator circuits require some form of temperature compensation to maintain the frequency of the signal produced by the MEMS resonator (referred to herein as the "output signal") at a target value defined by a particular application.

One way to address the temperature dependence of MEMS resonator materials is to employ additional electronic circuits that periodically adjust the frequency of the output signal to maintain the frequency at the target value despite temperature fluctuations within the system. However, temperature-compensation electronic circuits are complicated to design and implement, take up valuable chip area, add to the overall chip cost, increase total test time, and consume significant amounts of power.

Another way to address the temperature dependence of MEMS resonator materials is to decrease the magnitude of the TCF of the MEMS resonator by oxidizing the surface of the MEMS resonator beams. As is well-known, some oxides become stiffer at higher temperatures, thereby counteracting the behavior of the MEMS resonator material over temperature. The addition of silicon dioxide may reduce the magnitude of the TCF of the MEMS resonator to nearly 0 ppm/° C. This approach, however, has several major drawbacks.

One drawback is related to process control. The TCF of a MEMS resonator coated with oxide is dependent on the thickness of the oxide on its surface. However, in a manufacturing environment, controlling oxide growth to better than 10% may be challenging, making TCF control via oxide coating difficult as well. Another drawback is that the oxide layer may accumulate electrical charge on the surface. Charge build-up on the surface of a MEMS resonator may cause the frequency of the resonator to drift over time. Yet another drawback arises from design limitations inherent in MEMS resonator systems. In order to counteract the behavior of MEMS resonator materials, a sufficient amount of oxide should be grown or deposited on the MEMS resonator beams. However, a thick layer of oxide requires a longer deposition time and increases the risk of stress-induced cracking, especially during or after an annealing step. In addition, large amounts of oxide may cause the stress in the MEMS resonator beams to become poorly controlled, adding uncertainty to its desired resonant frequency. Finally, if the MEMS device is electrostatically actuated, a thick oxide layer may bridge or nearly bridge the gap between the MEMS resonator beams and their corresponding electrodes, leading to device failure. For example, if a MEMS resonator beam is 20 μm wide, and there is a gap of 0.7 μm between the beam and the electrodes, growing the 1.5-2 um of oxide necessary to reduce the TCF of the MEMS resonator is not possible.

As the foregoing illustrates, what is needed in the art is a better way to decrease the TCF of a MEMS resonator.

SUMMARY OF THE INVENTION

One embodiment of the present invention sets forth a method for fabricating a microelectromechanical system (MEMS) resonator having a reduced thermal coefficient of frequency (TCF). The method includes the steps of defining one or more slots within the MEMS resonator, fabricating the one or more slots, and filling the one or more slots with oxide.

One advantage of the disclosed method is that by growing or depositing oxide within the slots, the amount of oxide growth or deposition on the outside surfaces of the MEMS resonator may be reduced. As a result, the TCF of the MEMS resonator may be changed in a manner that is beneficial relative to prior art approaches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A through 3D illustrate the process of filling slots within a MEMS resonator with oxide, according to one embodiment of the present invention;

DETAILED DESCRIPTION

Figure 1A:
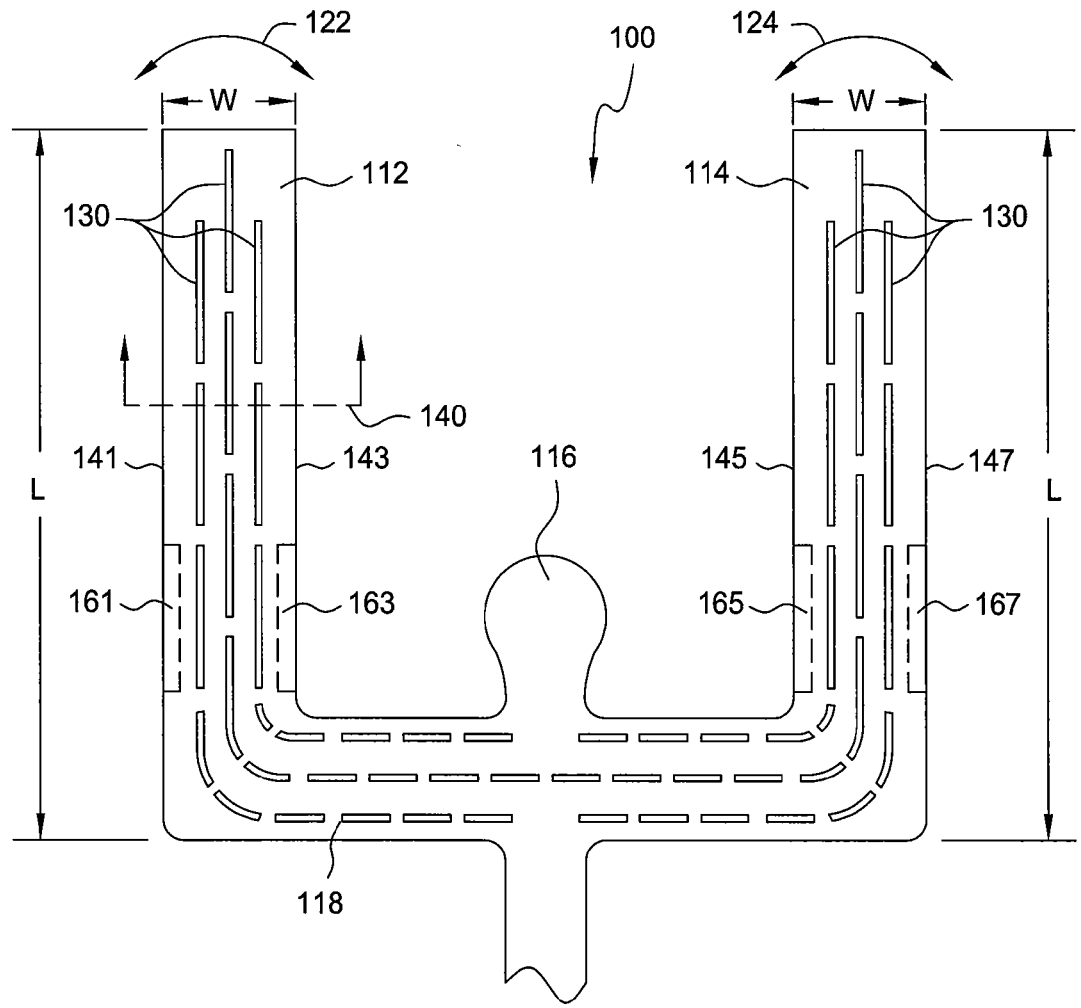
FIG. 1A is a conceptual diagram of a MEMS resonator, according to one embodiment of the present invention.

FIG. 1A is a conceptual diagram of a MEMS resonator 100, according to one embodiment of the present invention. As shown, the MEMS resonator 100 includes a MEMS resonator anchor 116 that fixes a base 118 of the MEMS resonator 100 to an underlying handle wafer (not shown). The MEMS resonator 100 further includes MEMS resonator beams 112 and 114 of length L that are mechanically coupled to the base 118. By applying a time-varying signal to drive electrodes (not shown) at a given frequency and, optionally, a DC voltage between the MEMS resonator 100 and the drive electrodes, electrostatic forces are generated that cause the MEMS resonator beams 112 and 114 to oscillate in a tuning fork fashion, as indicated by arrows 122 and 124, respectively. In response to the motion of the MEMS resonator beams 112 and 114, the capacitance between a sense electrode (not shown) and the MEMS resonator beams 112 and 114 changes at a substantially constant frequency at a constant temperature. The capacitance can be measured, and the resulting signal can then be used to generate a timing signal.

As also shown, the MEMS resonator 100 includes slots 130 positioned in different locations within the MEMS resonator beams 112 and 114 and the base 118. The slots 130 are filled with a compensating material (e.g., silicon dioxide, also referred to as oxide) that has a TCE with an opposite sign relative to the MEMS resonator material. As previously described herein, at higher temperatures, oxide typically becomes stiffer, while the MEMS resonator material (e.g., silicon) typically becomes less stiff. Thus, filling the slots 130 with oxide counters the changing properties of the MEMS resonator material over temperature. More specifically, the overall TCF of the MEMS resonator 100 is proportional to a weighted average of the TCE of the MEMS resonator material and the TCE of the oxide, based on the placement of the oxide in the strain field of the MEMS resonator 100.

Placing oxide in slots within the MEMS resonator itself offers several advantages over growing oxide on the outside surfaces of the MEMS resonator, as is done in prior art approaches. One advantage is increased control over the oxide growth process. Oxide growth in the slots may be self-limiting because the amount of oxide cannot exceed the size of the slots. Another advantage is that if oxide is also desired on the outside surfaces of the MEMS resonator adding oxide within the slots allows the amount of oxide on the outside surfaces of the MEMS resonator to be reduced. A thinner oxide layer on the outside surfaces enables oxide to be grown in a larger number of MEMS resonator systems without conflicting with the geometric and spatial constraints of those systems. In addition, better frequency control of the MEMS resonator may be achieved because the characteristics of the MEMS resonator elements become more predictable with thinner layers of oxide on the outside surfaces of the resonator elements. Furthermore, reducing the thickness of the oxide layers grown on the MEMS resonator decreases the stresses within the MEMS resonator material thereby reducing the risk of stress-induced cracking. Finally, reducing the amount of oxide may result in improved transduction within the MEMS resonator.

Persons skilled in the art will recognize that oxide may be placed in/on the MEMS resonator using growth, deposition, or a combination of both growth and deposition. Therefore, one should understand that anywhere an oxide growth is discussed in the present application, oxide deposition or a combination thereof could be used as well.

Furthermore, in lieu of to filling the slots with oxide, the slots described in the present application may be filled with any suitable compensating material that has a TCE with an opposite sign to the TCE of the MEMS resonator material. For example, in one embodiment, a MEMS resonator may be formed from $SiO_2$, slots may be filled with Si, sacrificial material may be Si, and cap/liner material may be $Si_xN_y$ (silicon nitride).

Figure 1B:
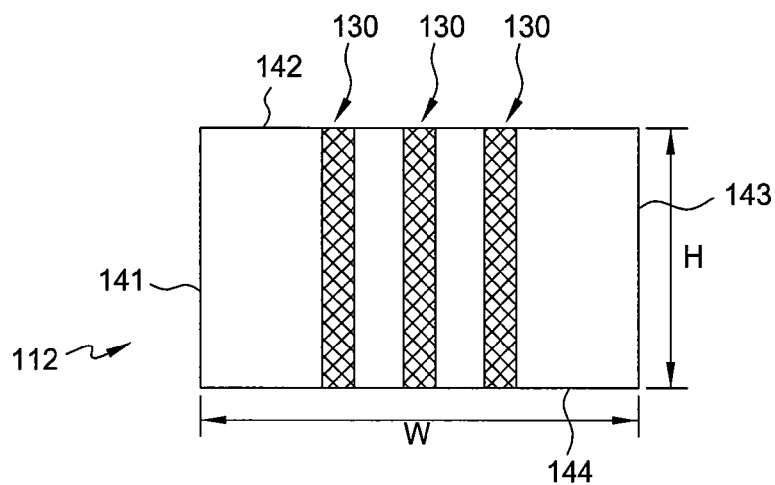
FIG. 1B illustrates a cross-section of the MEMS resonator beam of FIG. 1A, according to one embodiment of the present invention.

FIG. 1B illustrates a cross-section of the MEMS resonator beam 112 along line 140 of FIG. 1A. The cross-sectional view further illustrates the arrangement of the slots 130 within the MEMS resonator 100, according to one embodiment of the present invention. As shown, H indicates the height of the MEMS resonator beam 112, and W indicates the width of the MEMS resonator beam 112. The slots 130 may be lithographically defined from the top face 142, in the pattern illustrated in FIG. 1B, and extended all the way to the bottom face 144, as illustrated in FIG. 1B, in the form of narrow trenches. The oxide can be introduced within the slots 130 through the processes of growth, deposition, or a combination thereof. The pattern and number of slots may also be varied to meet design goals.

Referring back now to FIG. 1A, when oscillating, as indicated by the arrows 122 and 124, the MEMS resonator beams 112 and 114 are the resonating elements of the MEMS resonator 100, and are subject to flexural stresses. Along the length L of the MEMS resonator beam 112, the flexural stress is larger on outside sidewalls 141 and 143 and decreases towards the center of the MEMS resonator beam 112. Similarly, along the length L of the MEMS resonator beam 114, the flexural stress is larger on outside sidewalls 145 and 147 and decreases towards the center of the MEMS resonator beam 114. In addition, for both the MEMS resonator beams 112 and 114, the flexural stresses are relatively large near the base 118 and decrease towards the opposite end of each beam, away from the base 118. Thus, areas 161, 163, 165, and 167 near the base 118 indicate the regions of the MEMS resonator beams 112 and 114 that may be subject to the largest flexural stresses. As described in greater detail in FIG. 2, the greater the flexural stresses in a given area, the greater the dependence of the overall TCF of a MEMS resonator on the individual TCEs of the materials comprising that area. Therefore, placing the slots filled with oxide in the areas that experience large flexural stresses increases the effective contribution of the TCE of the oxide to the overall TCF of the MEMS resonator, which facilitates lowering the overall TCF of the MEMS resonator.

Figure 2:
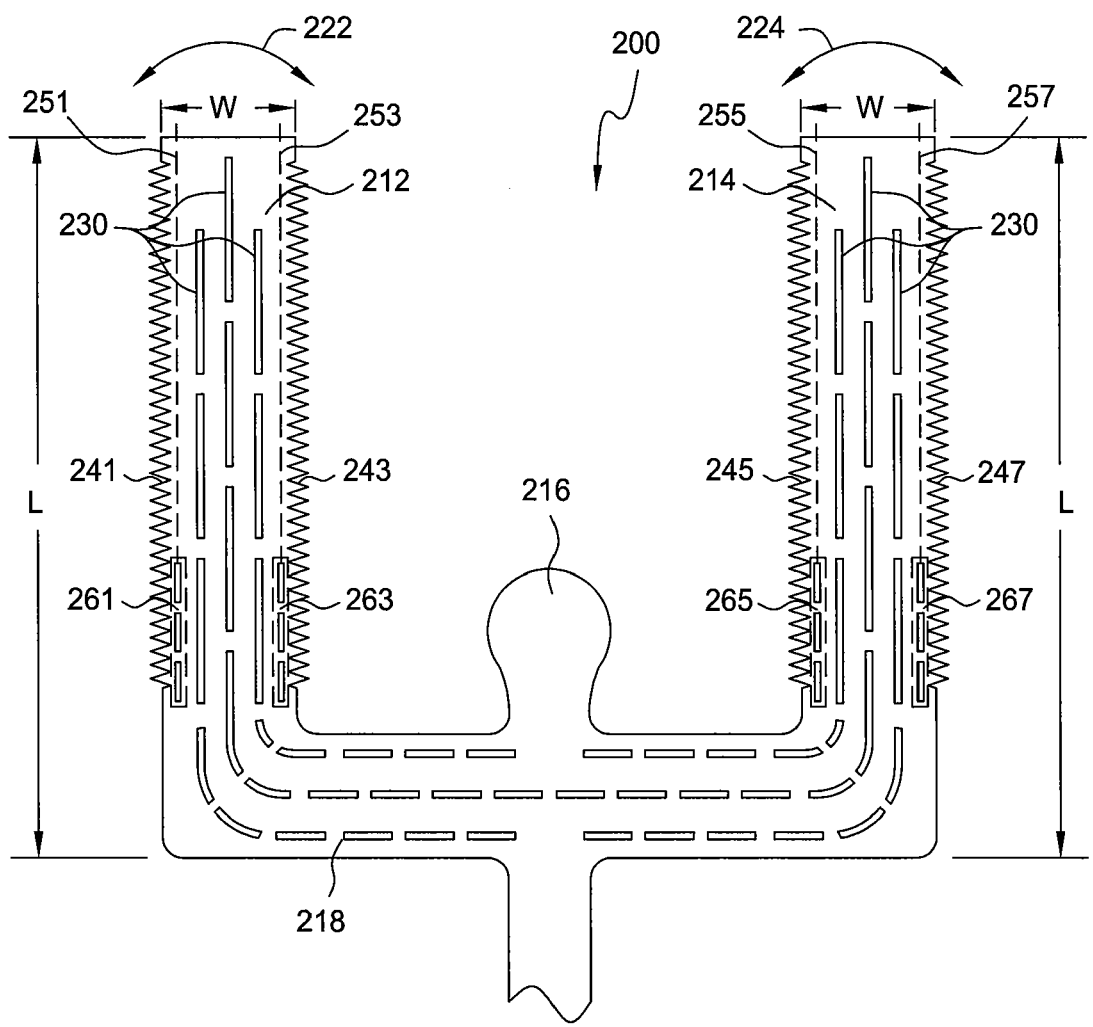
FIG. 2 is a conceptual diagram of a MEMS resonator, according to another embodiment of the present invention.

FIG. 2 is a conceptual diagram of a MEMS resonator 200, according to another embodiment of the present invention.

Similar to the MEMS resonator 100, the MEMS resonator 200 includes MEMS resonator beams 212 and 214, slots 230 filled with a compensating material (e.g., oxide) that has a TCE with an opposite sign relative to the MEMS resonator material, and a MEMS resonator anchor 216 that fixes a base 218 of the MEMS resonator 200 to an underlying handle wafer (not shown). Again, the MEMS resonator beams 212 and 214 of length L are mechanically coupled and oscillate in a tuning fork fashion, as indicated by arrows 222 and 224, respectively, leading to the generation of a reference signal.

As shown, the MEMS resonator 200 differs from the MEMS resonator 100 in that outside sidewalls 241, 243, 245, and 247 of the MEMS resonator beams 212 and 214 have serrated surfaces with a plurality of teeth. Cutting serrations into the outside edge of the resonator can shift the maximum strain field inward, along the base of the serrations near lines 251, 253, 255, and 257. For example, for the MEMS resonator beam 212, the flexural stresses are largest along the lines 251 and 253 that extend along the base of the teeth and decreases towards the outside sidewalls 241 and 243 and towards the center of the MEMS resonator beam 212. Similarly, for the MEMS resonator beam 214, the flexural stresses are largest along the lines 255 and 257 that extend along the base of the teeth and decreases towards the outside sidewalls 245 and 247 and towards the center of the MEMS resonator beam 214. Furthermore, for both the MEMS resonator beams 212 and 214, the flexural stress is relatively large near the base 218, and decreases to the tip of each beam. Thus, areas 261, 263, 265, and 267 near the base 218 indicate the regions of the MEMS resonator beams 212 and 214 that may be subject to the largest flexural stress, while the serrated teeth of the outside sidewalls 241, 243, 245, and 247 experience minimal stress when the MEMS resonator beams 212 and 214 oscillate during operation.

In various embodiments, the serrations may be of any suitable profile. Therefore, one should understand that anywhere serrated teeth are discussed in the present application, other irregular profiles could be used as well. For example, instead of having the serrated teeth on the outside sidewalls, the MEMS resonator beams may include outside sidewalls with rounded teeth profile, a sinusoidal profile, an "arc-to-point" profile, a "skewed teeth" profile, an interlocked profile, or a combination thereof.

Inserting compensating material in MEMS resonator beams 212 and 214 in regions that experience large stresses has a greater marginal impact on the overall stiffness of the MEMS resonator 200 than inserting compensating material in regions that experience lesser stresses. Thus, whenever possible, by placing slots filled with a compensating material in the regions of the largest stress, as shown with the slots 230 within the areas 261, 263, 265, and 267, the contribution of the compensating material in the slots 230 to the TCF of the MEMS resonator 200 is increased. Whenever placing slots filled with the compensating material in the regions of the largest stress is not technically feasible, placing slots filled with the compensating material in the regions subject to larger stresses relative to other regions, the contribution of the compensating material in the slots to the overall TCF of the MEMS resonator is still increased. Consequently, the contribution of the TCE of the compensating material to the overall TCF of the MEMS resonator, proportional to a weighted average of the TCE of the MEMS resonator material and the TCE of the compensating material, is also increased. As a result, the total amount of compensating material necessary to counteract the behavior of the MEMS resonator material and achieve a particular desired overall TCF value may further be reduced relative to prior art techniques due to placement of slots and spatial density of slots containing compensating material in the resonator. All of the advantages of further reducing the thickness of compensating material layers (e.g., oxide layers), discussed above, apply with equal force to the MEMS resonator 200.

In addition, since serrating the outside sidewalls 241, 243, 245, and 247 effectively shifts the regions of the largest flexural stresses within the MEMS resonator beams 212 and 214 further inward, the overall TCF of the MEMS resonator 200 is less sensitive to variations in the thickness of oxide grown on the outside sidewalls 241, 243, 245, and 245. Therefore, serrating the outside sidewalls 241, 243, 245, and 245 provides the benefit of increased tolerance in oxide growth variations during fabrication of the MEMS resonator 200.

FIGS. 3A through 3D illustrate the process of filling the slots 230 within the MEMS resonator 200 with oxide, according to one embodiment of the present invention. While the process is described with relation to the MEMS resonator 200, the same process applies to filling with oxide the slots 130 within the MEMS resonator 100.

FIG. 3A illustrates a cross-sectional view of the slots(?) 230 etched in the MEMS resonator beam 212 before the oxide is added. The original boundaries of the bottom and top faces of the MEMS resonator beam 212 are shown as top face 342 and bottom face 344, respectively. The original boundaries of the surfaces created by etching the slot 230 are shown as a left slot sidewall 313 and a right slot sidewall 315. FIG. 3B illustrates the slot 230 after an oxidation process has started. The oxide grows substantially equally on the top face 342, the bottom face 344, the left slot sidewall 313, and the right slot sidewall 315, as indicated with the cross-hatched areas. As a result of oxide growth, the boundaries of the top and bottom faces 342, 344 expand, as shown with oxide boundaries 352 and 354. Similarly, the boundaries of the left and right slot sidewalls 313, 315 expand as well, as shown with oxide boundaries 323 and 325. During the oxidation process, the oxide may grow both outward from the original boundaries (about 54% of the growth) and inward from the original boundaries of the material (about 46% of the growth). Thus, the boundaries of the MEMS resonator material shift inwards, as shown with oxide boundaries 333 and 335.

As the oxide continues to grow, the oxide boundaries 352, 354, 323, 325, 333, and 335 expand further in their respective directions. Eventually, the lines 323 and 325 come so closer together that the slot 230 is plugged shut, as shown in FIG. 3C, leaving a small gap 330. Since free oxygen molecules cannot easily reach the gap 330, the oxide growth in the slot 230 stops. The moment in the oxidation process when the slot 230 is plugged shut is referred to herein as "pinch-off." After pinch-off, the oxide continues to grow only on the top and bottom faces 342, 344, as illustrated in FIG. 3D, where the oxide boundaries 352 and 354 are expanded even further.

In different implementations, the slots 230 may be filled completely, by allowing the oxidation or deposition process to continue past pinch-off (as illustrated in FIG. 3D), or partially, by stopping the oxidation or deposition process before pinch-off (as illustrated in FIG. 3B). Completely filling the slot 230 with oxide increases the range of allowable oxide thickness and is attractive for manufacturing control because of the pinch-off. However, when the oxide boundaries 323 and 325 come into contact with each other, excessive in-plane stress and stress gradients may arise, which may be detrimental to the characteristics of the MEMS resonator 200. For this reason, partial filling of the slots 230 may be preferred since the oxide boundaries 323 and 325 do not come into contact with one another. After the slots 230 are partially filled with oxide, the remaining gap in the slot 230 may be filled with a low-stress cap layer, such as silicon.

Figure 4B:
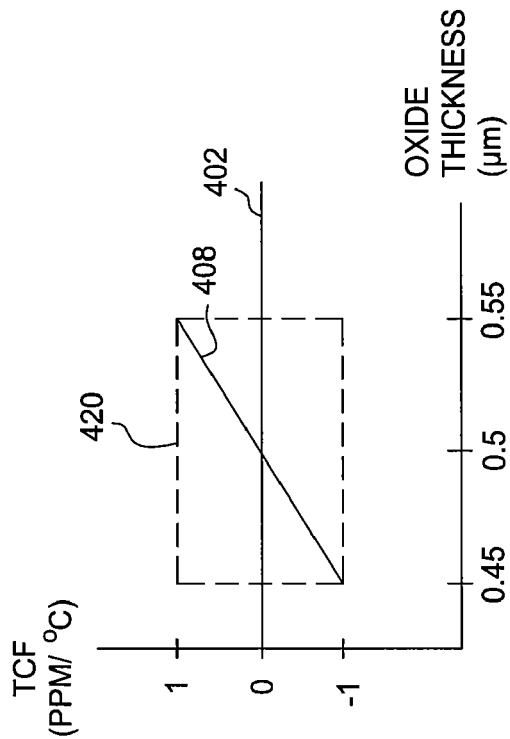
FIG. 4B is a magnified view of the area of FIG. 4A where the TCF of a MEMS resonator with slots is within 1 ppm/° C.
Figure 4A:
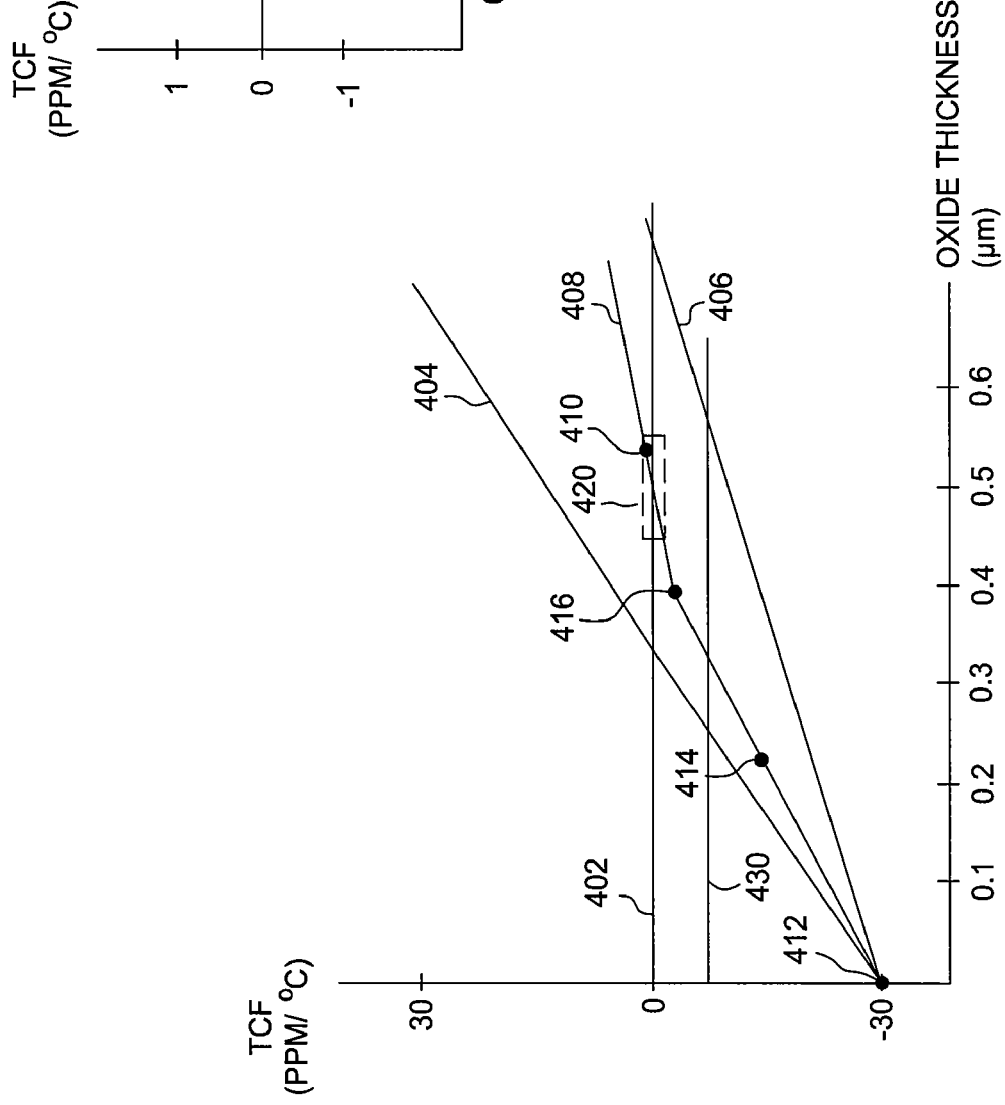
FIG. 4A illustrates the effects of placing slots filled with oxide in areas of high strain concentration on the TCF of a MEMS resonator, according to one embodiment of the present invention.

FIG. 4A illustrates the effects of placing slots filled with oxide in areas of high strain concentration on the TCF of a MEMS resonator, according to one embodiment of the present invention. As shown, a line 402 is a reference line, indicating a TCF of 0 ppm/° C. A line 404 represents the TCF of a conventional single ended cantilever beam MEMS resonator with a serrated 4 μm-wide beam for different oxide thicknesses on the outside sidewalls of the MEMS resonator beam. A line 406 represents the TCF of a conventional single ended cantilever beam MEMS resonator with a serrated 8 μm-wide beam for different oxide thicknesses on the outside sidewalls of the MEMS resonator beam. The term "conventional" implies that the MEMS resonator is uniformly oxidized on the surface and does not include slots with oxide within the MEMS resonator beam. When the conventional MEMS resonators do not contain any oxide on their surfaces (point 412 in FIG. 4A), the TCF of those resonators is −30 ppm/° C. As shown, the slope of the line 406 is smaller than the slope of the line 404, indicating that more oxide must be grown on the surface of the MEMS resonator with a 8 μm-wide beam compared to the MEMS resonator with a 4 μm-wide beam to reduce the TCF to a particular target value.

As also shown in FIG. 4A, line 408 represents the TCF of a single ended cantilever beam MEMS resonator with a serrated 19 μm-wide beam containing slots filled with oxide. Referring back now to FIGS. 3A through 3D, the point 412 on the line 408 corresponds to FIG. 3A, where the process to fill the slots with oxide has not yet started. Point 414 on the line 408 corresponds to FIG. 3B, where the slots are partially filled with the oxide. Point 416 on the line 408 corresponds to FIG. 3C, where, at pinch-off, the oxide plugs the slot shut. Between the points 412 and 416, the slope of the line 408 is greater than the slope of the line 406. Again, a greater slope indicates that a thinner layer of oxide is needed on the surface of the MEMS resonator with slots and a 19 μm-wide beam compared to the conventional MEMS resonator with a 8 μm-wide beam to reduce the TCF to a particular target value. The line 408 has a greater slope between the points 412 and 416 than the line 406 because, between the points 412 and 416, the overall TCF of the MEMS resonator with slots is dominated by the oxide growth in the slots. As previously described, positioning the slots in the regions of the MEMS resonator beam that are subject to the largest flexural stresses increases the contribution of the oxide in the slots to the overall TCF of the MEMS resonator. In addition, many slots may be placed in or near these regions. As a result, the total amount of oxide on the surfaces of the MEMS resonator beam needed to decrease the magnitude of TCF of the MEMS resonator from −30 ppm/° C. to a particular target value is reduced. For example, as indicated with a line 430, in order to reduce the TCF to −5 ppm/° C., 0.6 μm of oxide is required to be grown on the surfaces of the conventional MEMS resonator with a 8 μm-wide beam. However, only about 0.33 μm of oxide is required to be grown on the surfaces of the MEMS resonator with slots and a 19 μm-wide beam to achieve the same TCF.

Point 416 on the line 408 corresponds to FIG. 3D, where, after pinch-off, the oxide continues to grow on the bottom and top faces of the MEMS resonator beam. After the point 416, the slope of the line 408 is less than the slope of the line 406. The slope of the line 408 decreases after the point 418 because, after the oxide plugs the slots shut, the overall TCF of the MEMS resonator with slots is dominated by the oxide growth on the bottom and top faces of the MEMS resonator beam. Between point 412 and point 416, the overall TCF of the MEMS resonator with slots is not strongly influenced by oxide growth (deposition) on its sidewalls 241, 243, 245, 247 because the serration of the surface routes the strain field away from oxide grown or deposited on these surfaces. On a MEMS resonator with slots but without the serration, the slope of the line 408 before and after the point 416 would be greater.

Persons skilled in the art will recognize that, in order to improve manufacturability, the slope of the TCF curve for a MEMS resonator, as the curve crosses through TCF=0, should be minimized. By doing so, the TCF of the MEMS resonator may remain within a desired range for a larger range of oxide thicknesses. For example, FIG. 4B is a magnified view of an area 420 where the TCF of the MEMS resonator with slots is within 1 ppm/° C. As shown, the value of oxide thickness for which the TCF of the MEMS resonator with slots is 0 ppm/° C. is 0.5 μm and the range of the oxide thickness for which the TCF of the MEMS resonator with slots is within ±1 ppm/° C. is 0.1 μm. Thus, the design of the MEMS resonator with slots achieves the desired overall TCF value with a thinner layer of oxide, while allowing variations in oxide thickness to be as large as ±10%. In addition, it allows for increased tolerance range in dimensions of resonator prior to oxide growth or deposition.

Figure 5:
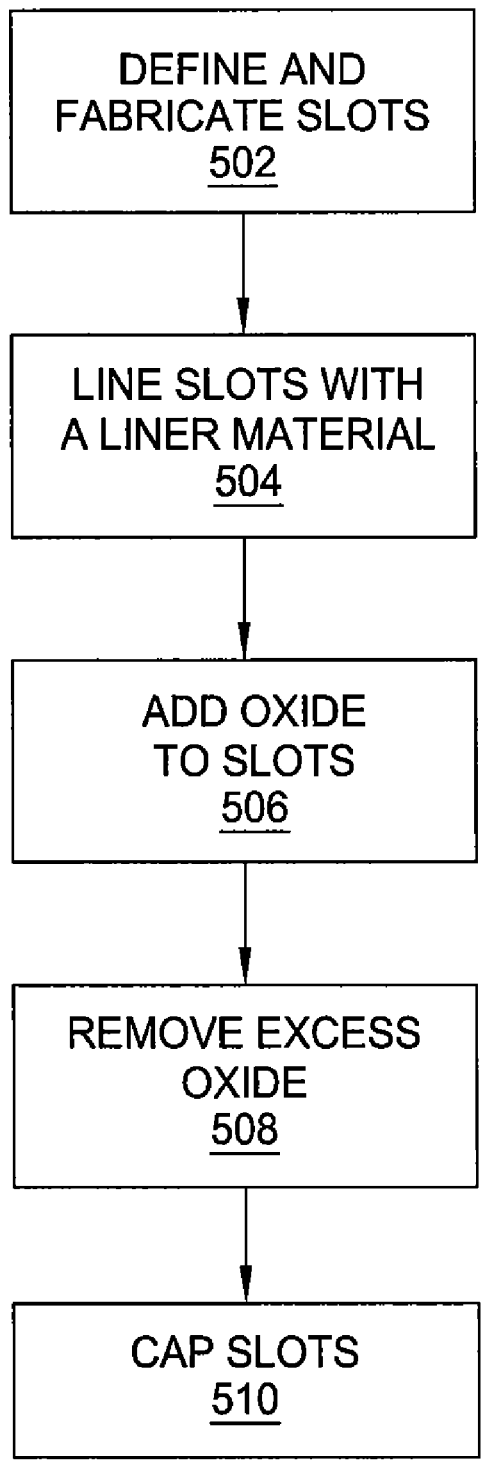
FIG. 5 sets forth a flow diagram of method steps for filling slots within a MEMS resonator with oxide, according to another embodiment of the present invention.

FIG. 5 sets forth a flow diagram of method steps for filling slots within the MEMS resonator 200 with oxide, according to another embodiment of the present invention. Again, while the process is described with relation to the MEMS resonator 200, the same process applies with equal force to filling the slots 130 within the MEMS resonator 100 with oxide.

The method begins in step 502, where the slots 230 are lithographically defined and fabricated. In step 504, the slots 230 are lined with a liner material such as silicon, resistant to the release etchant, commonly hydrofluoric (HF) acid. In step 506, oxide is added to the slots 230 through oxide growth, deposition, or a combination thereof. Depending on the particular application, the slots 230 may be filled with oxide completely or partially, as described above. In step 508, the excess oxide is removed from the MEMS resonator 200 so that the oxide remains only within the slots 230. Finally, in step 510, the slots 230 are capped with a capping material resistant to the release etchant. Again, silicon may be used as a capping material.

Figure 6A:
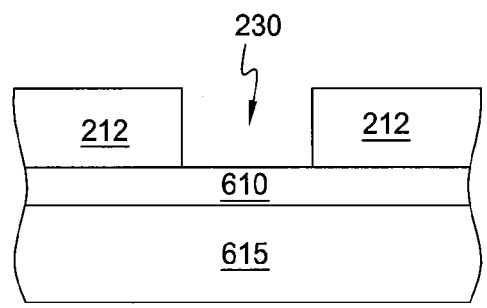
FIGS. 6A through 6E illustrate the process of completely filling the slots within the MEMS resonator of FIG. 2 with oxide, according to the method steps of FIG. 5.
Figure 6B:
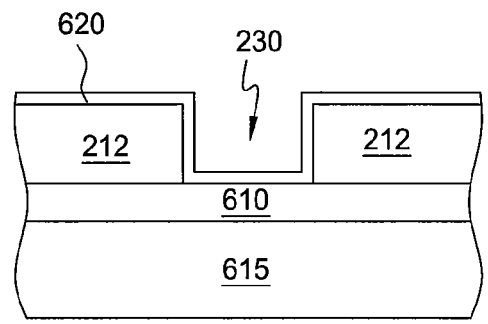
Figure 6C:
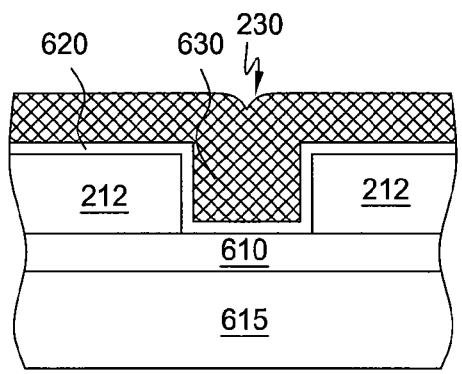
Figure 6D:
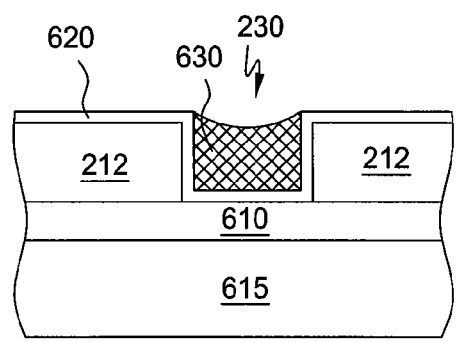
Figure 6E:
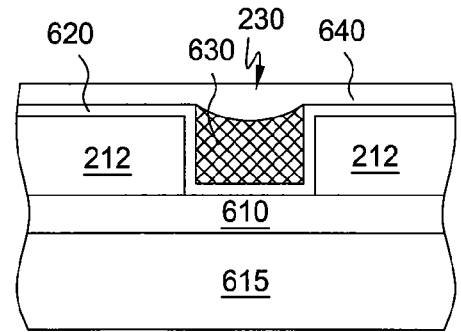

FIGS. 6A through 6E illustrate the process of completely filling the slots 230 within the MEMS resonator 200 with oxide, according to the method steps of FIG. 5. FIG. 6A illustrates the slot 230 etched in the MEMS resonator beam 212 (step 502). As shown, the MEMS resonator beam 212 is fabricated on top of a buried oxide layer 610, which is fabricated on top of a handle wafer 615. FIG. 6B illustrates the slot 230 lined with a liner material 620 resistant to the release etch process (step 504). FIG. 6C illustrates the slot 230 filled completely with oxide 630 (step 506). FIG. 6D illustrates the excess oxide 630 removed from the surfaces of the MEMS resonator beam 212 such that the oxide 630 remains only within the slot 230 (step 508). FIG. 6E illustrates the slot 230 capped with a capping material 640 (step 510).

Figure 7A:
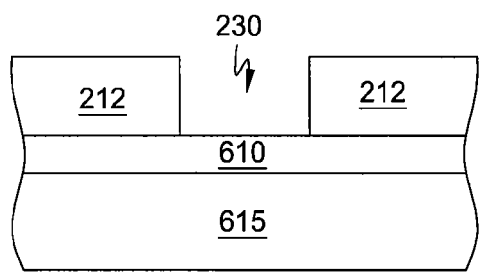
FIGS. 7A through 7E illustrate the process of partially filling the slots within the MEMS resonator of FIG. 2 with oxide, according to the method steps of FIG. 5.
Figure 7B:
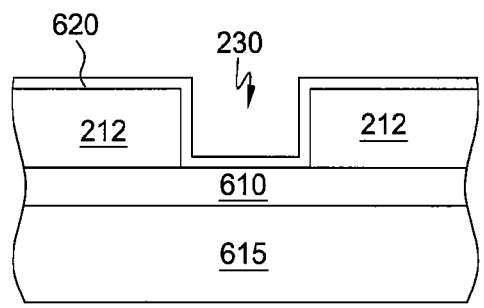
Figure 7C:
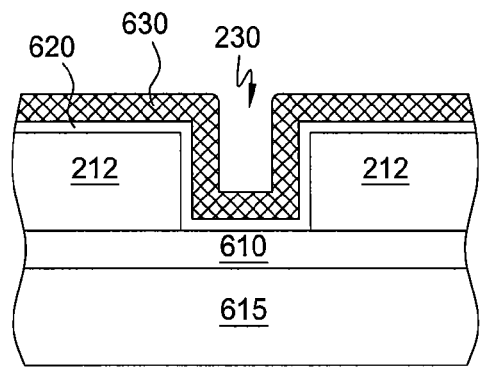
Figure 7D:
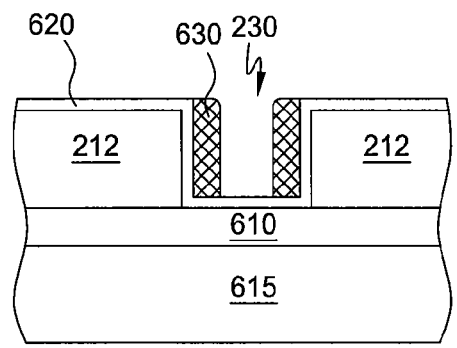
Figure 7E:
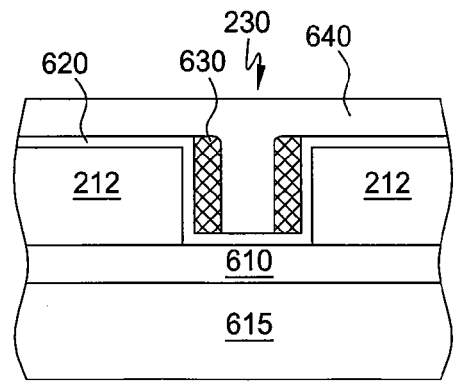

FIGS. 7A through 7E illustrate the process of partially filling the slots 230 within the MEMS resonator 200 with oxide, according to the method steps of FIG. 5. FIG. 7A illustrates the slot 230 etched in the MEMS resonator beam 212 (step 502). As shown, the MEMS resonator beam 212 is fabricated on top of the buried oxide layer 610, which is fabricated on top of the handle wafer 615. FIG. 7B illustrates the slot 230 lined with the liner material 620 resistant to the release etch process (step 504). FIG. 7C illustrates slot 230 partially filled with the oxide 630 (step 506). FIG. 7D illustrates the excess oxide 630 removed from the surfaces of the MEMS resonator beam 212 such that the oxide 630 remains only within the partially filled slot 230 (step 508). Finally, FIG. 7E illustrates the partially filled slot 230 capped with the capping material 640.

The particular process that may be implemented to fill the slots 230 with oxide depends on when the oxidation process takes place in relation to the HF vapor etching step during the fabrication of the MEMS resonator 200. Persons skilled in the art will recognize that the step of HF vapor etching is intended to etch the buried oxide layer 610 and release the MEMS resonator 200. If the process of filling the slots 230 with oxide is carried out after the release etching step, then the process described in FIGS. 3A through 3D, above, may be implemented. If, however, the process of filling the slots 230 with oxide is carried out before the HF vapor etching step, then the HF vapor may etch not only the buried oxide layer 610, but also the oxide within the slots 230. In some devices, some etching of the oxide within the slots may be acceptable and a liner and cap are not required. Additionally, if compensating material is not substantially affected by release etchant, a cap/liner may not be needed. The additional steps of lining and capping the slots 230 with silicon, as described in FIGS. 5, 6A through 6E, and 7A through 7E above, are included to prevent the HF vapor from etching the oxide in the slots 230 when the buried oxide layer 610 is etched. In this manner, when the MEMS resonator 200 is released after the buried oxide layer 610 is etched with the HF vapor, the oxide remains embedded within the slots 230.

In addition to the foregoing, the capping material 640 ensures that the surface of the MEMS resonator 200 remains conductive which prevents charge from accumulating on the surface of the oxide 630. As a result, the electrostatic problems previously described herein may be eliminated. The liner material may also be made conductive for similar reasons.

Figure 8:
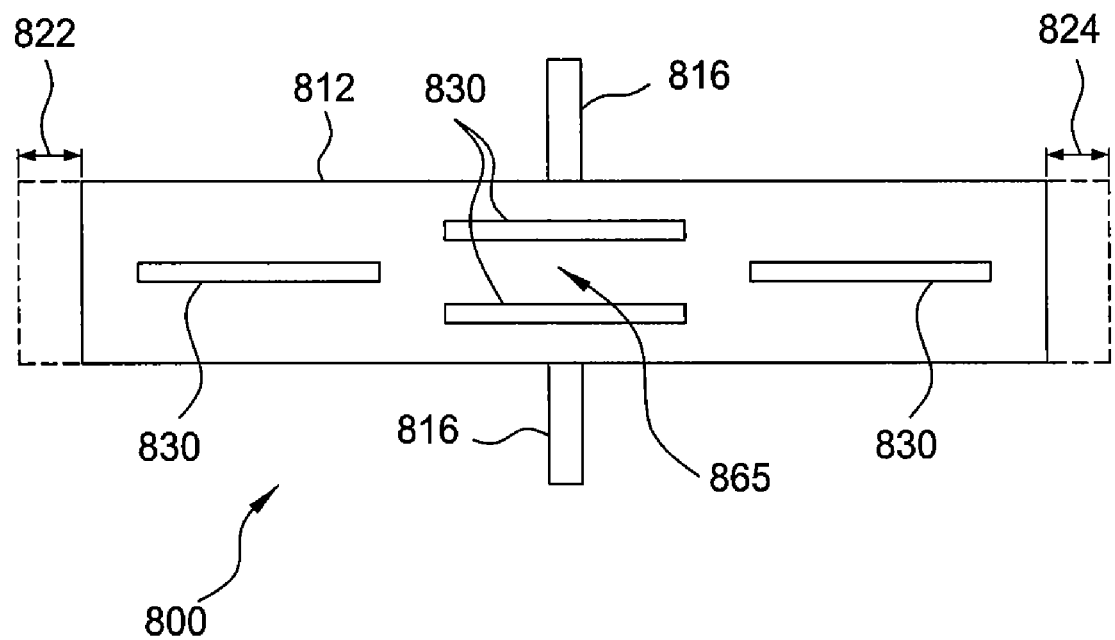
FIG. 8 is a conceptual diagram of an extensional resonator, according to one embodiment of the present invention.

The foregoing description applies to MEMS resonators that are comprised of resonating elements that exhibit flexural (bending) mechanical modes of resonance. Some resonator devices may include resonating elements that exhibit extensional (stretching) modes of resonance. Extensional resonators may also be temperature compensated using structures that include slots filled with a compensating material. FIG. 8 is a conceptual diagram of an extensional resonator 800, according to one embodiment of the present invention. The extensional resonator 800 includes an extensional resonator beam 812 configured as a straight bar and anchored near its center with an anchor 816. In other embodiments, extensional mode resonators may include plates, rings, or other shapes and structures.

The extensional resonator beam 812 oscillates in a stretching fashion, as indicated by arrows 822 and 824, leading to the generation of a reference signal. The extensional resonator 800 also includes slots 830 filled with a compensating material (e.g., oxide) that has a TCE with an opposite sign relative to the MEMS resonator material.

In an extensional mode resonator, strain fields may be more uniformly distributed through the thickness and width of the resonator. For example, for the extensional resonator 800, the lowest order extensional resonant mode will have its highest strain field in an area 865 (i.e., the area 865 is a region subject to the largest extensional stress). The maximum stress regions in an extensional mode resonator may not be situated near the edges of the resonator beam.

Similarly to the MEMS resonator 200, adding compensating material to the MEMS resonator beam 812 in regions that experience large stresses has a greater marginal impact on the TCF of the MEMS resonator 800 than adding compensating material in regions that experience lesser stress. Thus, whenever possible, by placing slots filled with a compensating material in the regions of the largest extensional stress, as shown with the slots 830 within the area 865, the contribution of the compensating material in the slots 830 to the TCF of the MEMS resonator 800 is increased. Whenever placing slots filled with compensating material in the regions of the largest extensional stress is not technically feasible, placing slots filled with compensating material in the regions of larger stress rather than placing the slots with compensating material in the regions of lesser stress, the contribution of the compensating material in the slots to the overall stiffness of the MEMS resonator is still increased. Consequently, the contribution of the TCE of the compensating material to the overall TCF of the MEMS resonator, proportional to a weighted average of the TCE of the MEMS resonator material and the TCE of the compensating material, is also increased.

More specifically, for extensional mode resonating elements, experimentation has shown that a ratio of about 40% compensating material (e.g., oxide) to MEMS resonator material (e.g., silicon) effectively balances the TCF of the MEMS resonator. The ratio applies to the thickness of the MEMS resonating element in a plane perpendicular to the stretching movement of the MEMS resonating element.

Figure 9:
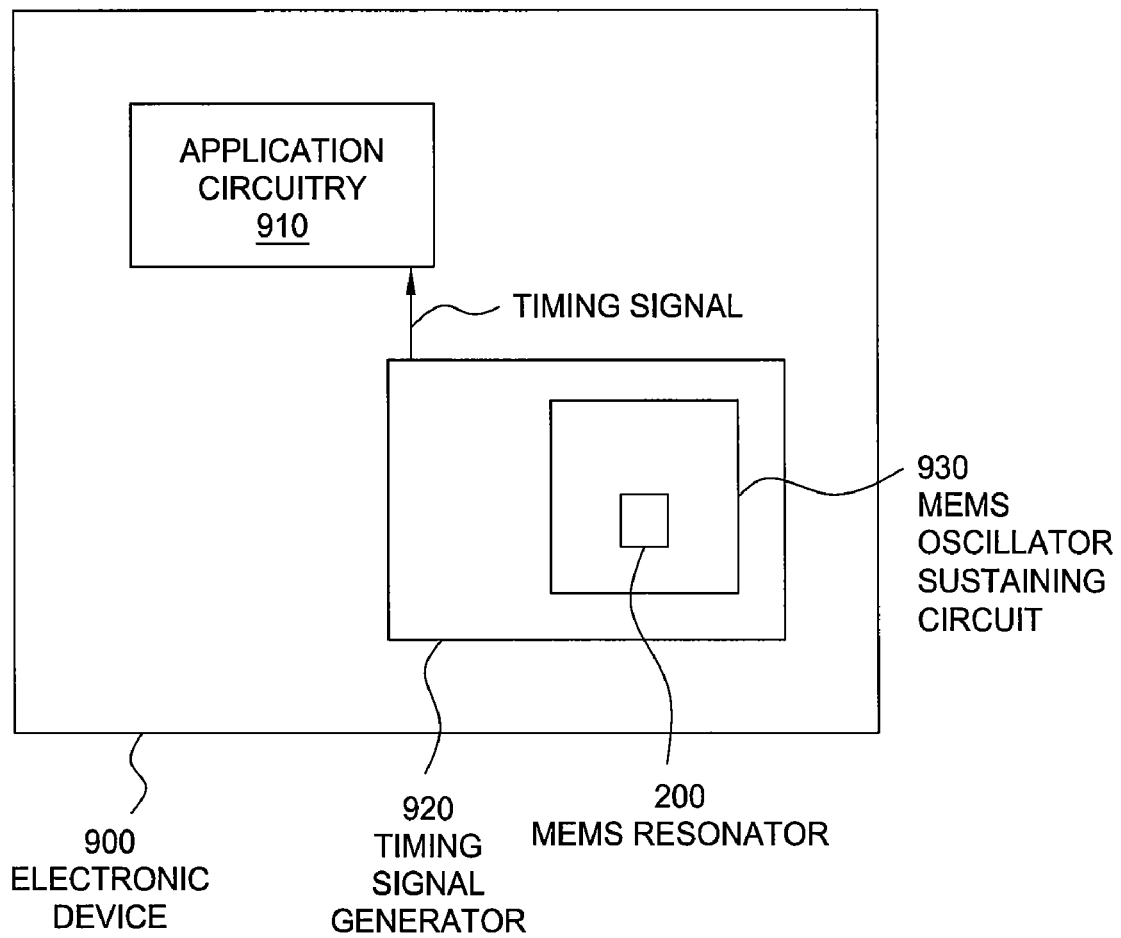
FIG. 9 is a conceptual diagram of an electronic device configured to implement one or more aspects of the present invention.
Figure 10A:
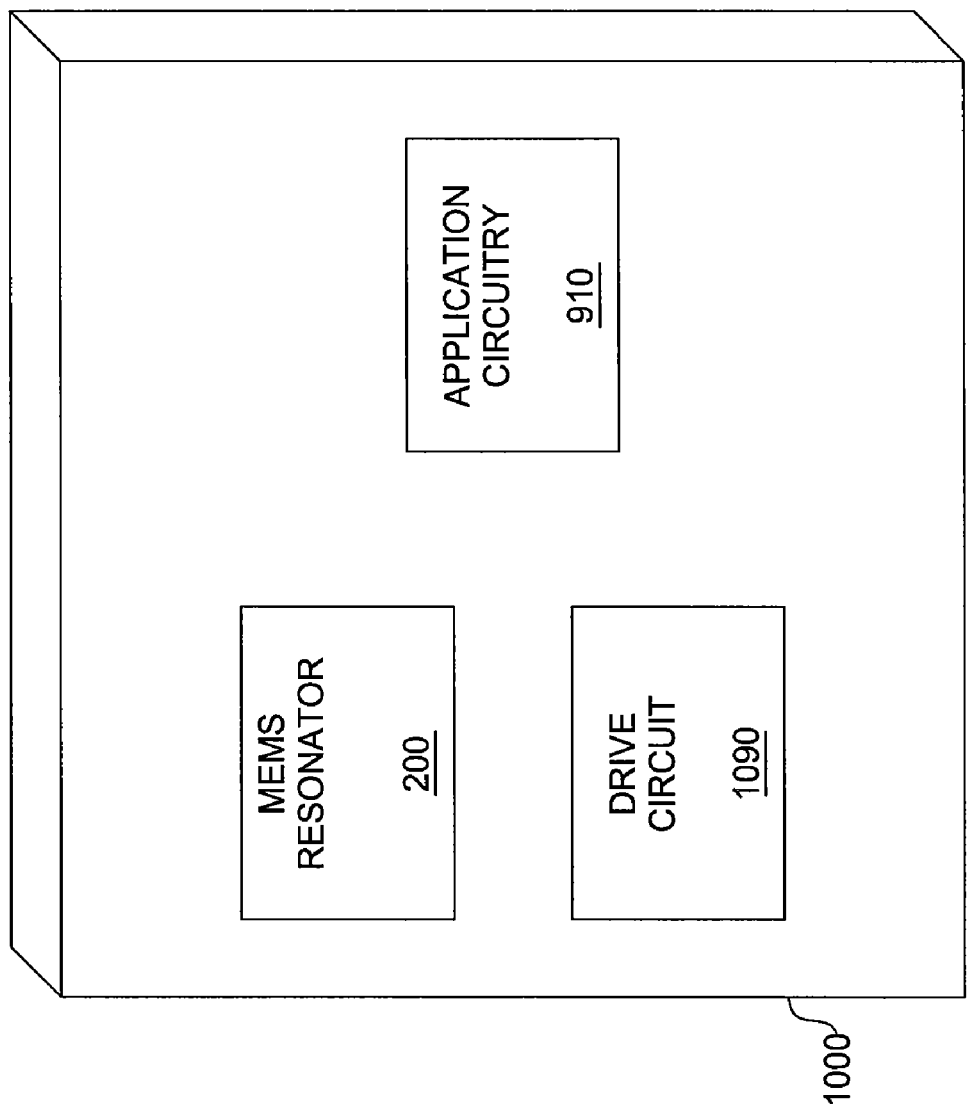
FIGS. 10A through 10E illustrate different ways to position a MEMS resonator, a drive circuit, and application circuitry on one or more substrates.
Figure 10B:
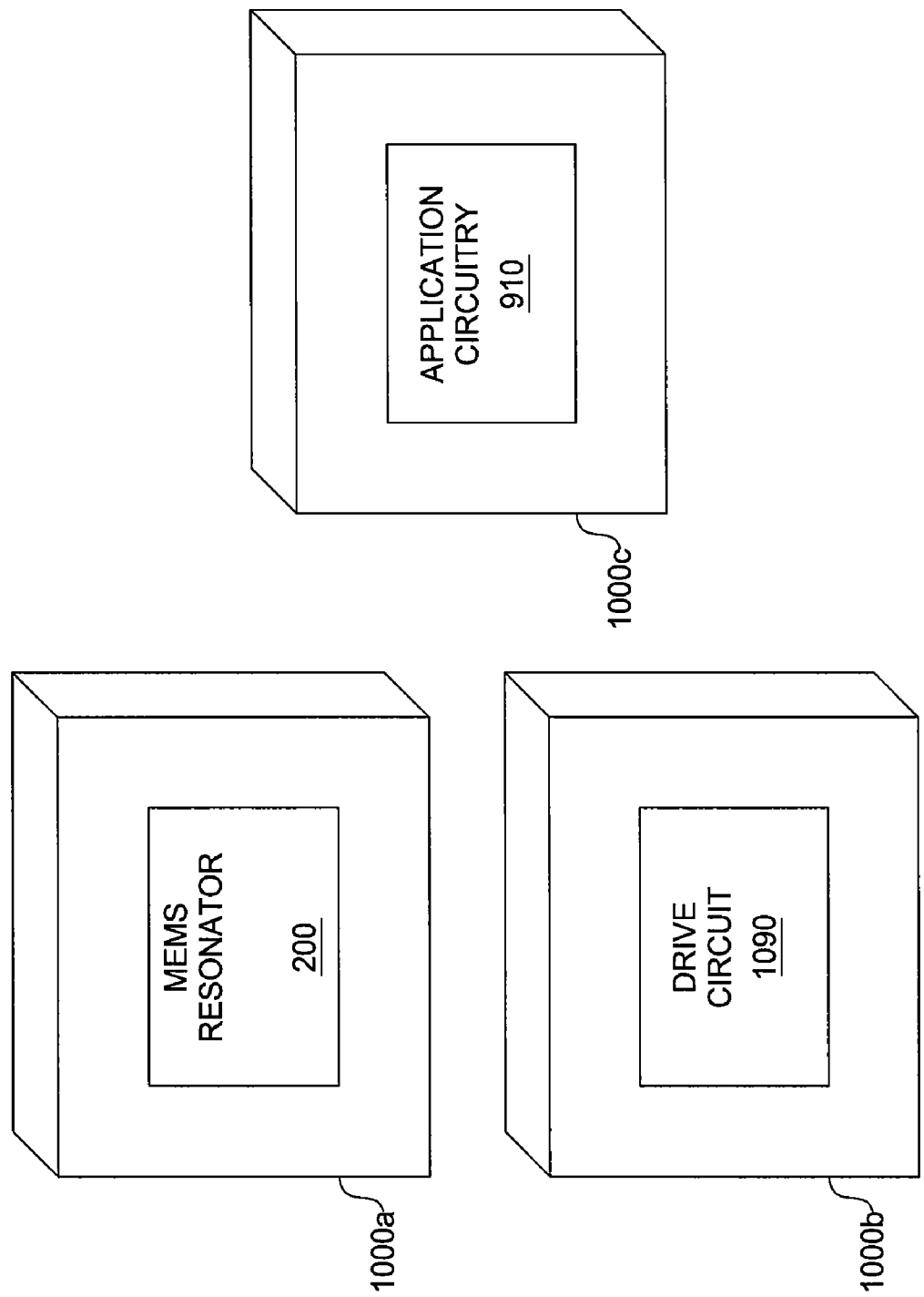
Figure 10C:
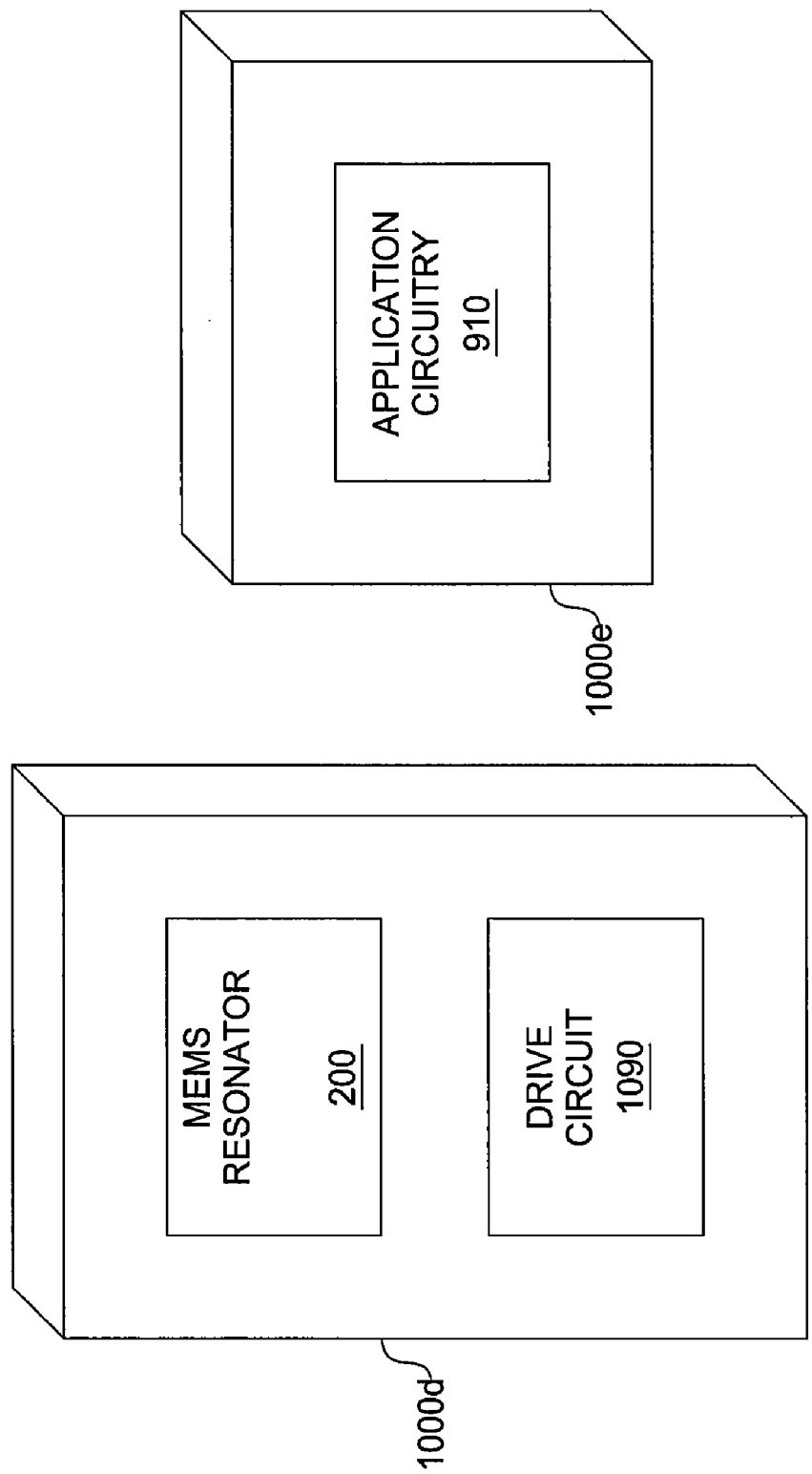
Figure 10D:
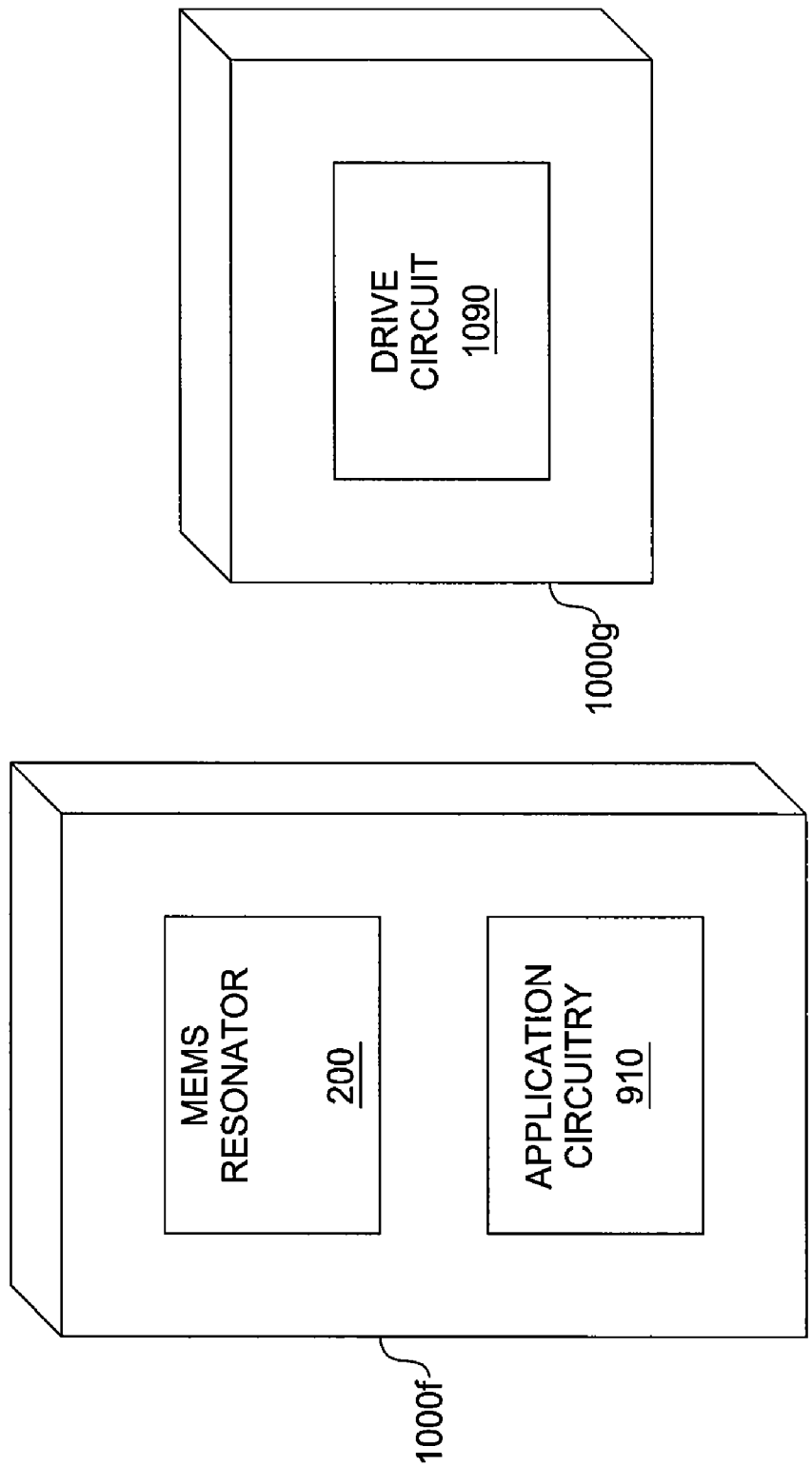
Figure 10E:
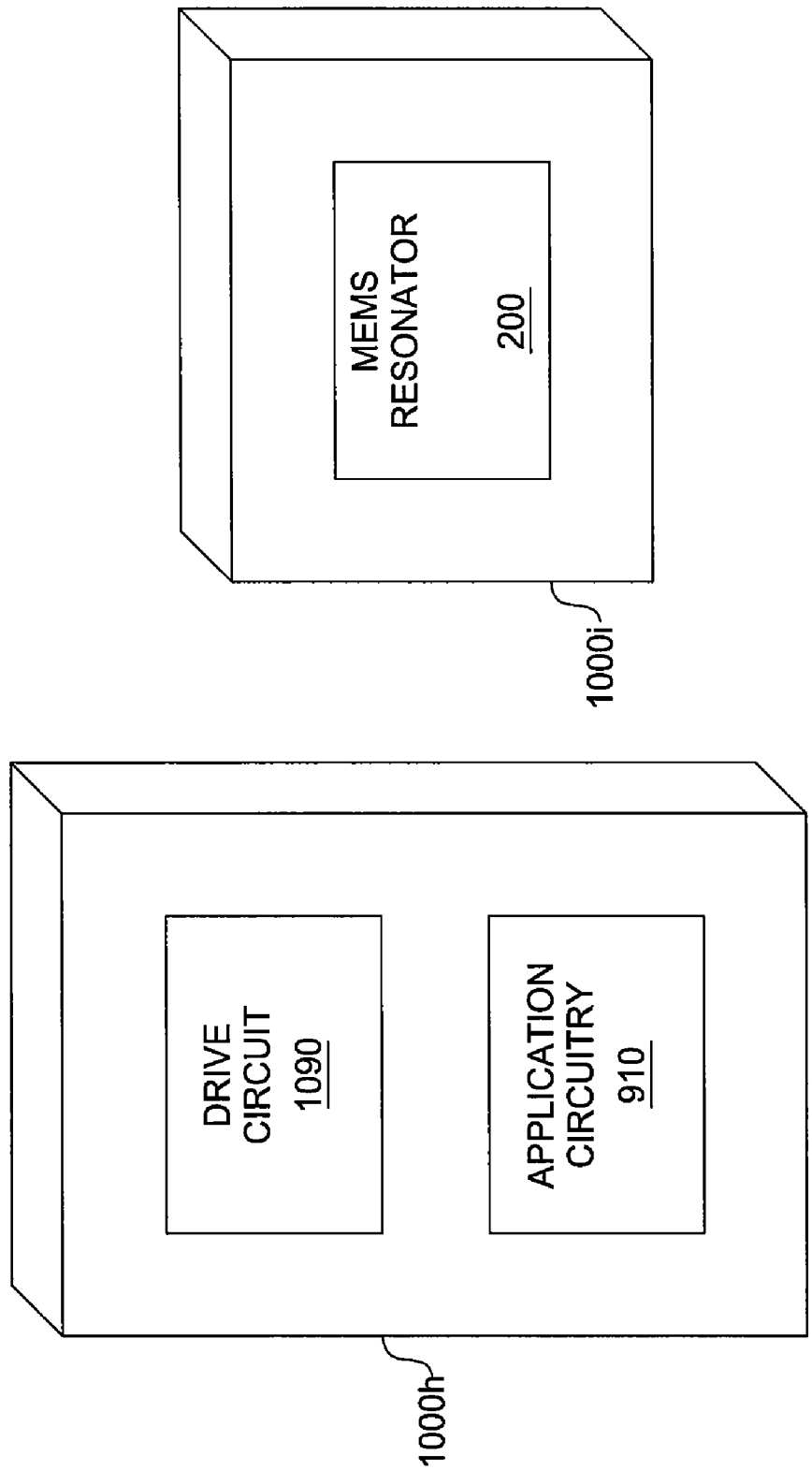

FIG. 9 is a conceptual diagram of an electronic device 900 configured to implement one or more aspects of the present invention. As shown, electronic device 900 includes, without limitation, a timing signal generator 920 configured to provide a timing signal to application circuitry 910. The timing signal generator 920 includes a MEMS oscillator sustaining circuit 930. In one embodiment, the MEMS oscillator sustaining circuit 930 includes the MEMS resonator 200, where the serrated MEMS resonator beams 212 and 214 are fabricated as shown in FIG. 2. In another embodiment, the MEMS oscillator sustaining circuit 930 may include the MEMS resonator 100, where the MEMS resonator beams 112 and 114 are fabricated as shown in FIG. 1. In yet another embodiment, the MEMS oscillator sustaining circuit 930 may include the extensional resonator 800, where the extensional resonator beam 812 is fabricated as shown in FIG. 8, or any other suitable MEMS resonator according to the present invention. Furthermore, the MEMS oscillator sustaining circuit 930 includes a drive circuit (not shown) that drives the MEMS resonator 200. Electronic device 900 may be any type of electronic device that includes application circuitry requiring a timing signal. Some examples of electronic device 900 include, without limitation, an electronic wrist watch, a personal digital assistant, or a cellular phone.

Using FIG. 9 as an example, in alternate embodiments, the MEMS resonator 200 may be disposed on/in the same substrate or on/in different substrates than the drive circuit. Moreover, the application circuitry 910 may be disposed on/in the same substrates as the MEMS resonator 200 and/or the drive circuit. FIGS. 10A through 10E illustrate different ways to position the MEMS resonator 200, a drive circuit 1090, and the application circuitry 910 on one or more substrates. In particular, the MEMS resonator 200 and/or the drive circuit 1090 and/or the application circuitry 910 may be integrated on/in the same substrate 1000, as shown on FIG. 10A, on/in different substrates 1000a, 1000b and 1000c, as shown on FIG. 10B, or on/in different substrates 1000d, 1000e, 1000f, 1000g, 1000h and 1000i, as shown on FIGS. 10C, 10D, and 10E. All permutations and combinations thereof are intended to fall within the scope of the present invention.

While the foregoing is directed to embodiments of the present invention, other and further embodiments of the invention may be devised without departing from the basic scope thereof, and the scope thereof is determined by the claims that follow.

We claim:

1. A method of manufacturing a microelectromechanical system (MEMS) resonator having a reduced magnitude of thermal coefficient of frequency (TCF) wherein the MEMS resonator includes a resonating element which oscillates, the method comprising:
    defining one or more slots within the resonating element of the MEMS resonator;
    fabricating the one or more slots within the resonating element; and
    filling the one or more slots with a compensating material, wherein a temperature coefficient of Young's Modulus (TCE) of the compensating material has a sign opposite to a TCE of a material comprising the resonating element.

2. The method of claim 1, wherein the one or more slots are defined in a region of the resonating element subject to larger stresses relative to other regions of the MEMS resonator.

3. The method of claim 2, wherein the resonating element oscillates via an extensional and/or flexural mode.

4. The method of claim 3, wherein a cross section of the resonating element that is perpendicular to the extensional and/or flexural mode comprises approximately 40% of the compensating material.

5. The method of claim 2, wherein the stresses decrease from an outside sidewall of the resonating element to the center of the resonating element, and a region proximate to the outside sidewall of the resonating element is the region subject to the relatively larger stresses.

6. The method of claim 2, wherein an outside sidewall of the resonating element has a serrated surface.

7. The method of claim 6, wherein the serrated surface comprises teeth.

8. The method of claim 7, wherein the resonating element is configured to oscillate in a tuning fork fashion during operation, and a region proximate to the base of the teeth is the region subject to the largest flexural stresses.

9. The method of claim 6, wherein the serrated surface comprises an irregular profile.

10. The method of claim 2, wherein the resonating element is configured to oscillate in an extensional mode during operation, and a region proximate to where the resonating element connects to a support element in the MEMS resonator is the region subject to the relatively larger stresses.

11. The method of claim 1, wherein the one or more slots are filled completely with the compensating material.

12. The method of claim 11, further comprising filling a gap in each of the one or more slots with a low-stress cap layer.

13. The method of claim 12, wherein the low-stress cap layer comprises silicon.

14. The method of claim 1, further comprising lining the one or more slots with a liner material resistant to an etch process, prior to filling the one or more slots with the compensating material.

15. The method of claim 14, wherein the liner material comprises silicon.

16. The method of claim 14, further comprising removing excess of the compensating material from the surfaces of the resonating element such that the compensating material remains substantially only within the one or more slots within the resonating element.

17. The method of claim 16, further comprising capping the one or more slots with a conductive capping material resistant to the etch process.

18. The method of claim 17, wherein the conductive capping material comprises silicon.

19. The method of claim 17, wherein the one or more slots are filled completely with the compensating material.

20. The method of claim 19, further comprising filling a gap in each of the one or more slots with a low-stress cap layer prior to capping the one or more slots with the conductive capping material.

21. The method of claim 20, wherein the low-stress cap layer comprises silicon.

22. The method of claim 1, wherein the one or more slots are defined lithographically.

23. The method of claim 1, wherein the compensating material comprises oxide.

24. The method of claim 23, wherein the one or more slots are filled with oxide through one of the processes of (i) oxide growth, (ii) oxide deposition, or (iii) a combination of oxide growth and oxide deposition.

* * * * *